United States Patent [19]

Goodheart et al.

[11] 3,911,377

[45] Oct. 7, 1975

[54] RELAXATION OSCILLATOR HAVING STABLE PULSE WIDTH

[75] Inventors: Paul Goodheart, Piscataway; Abel Ching Nam Sheng, Morris Plains, both of N.J.

[73] Assignee: RCA Corporation, New York, N.Y.

[22] Filed: Sept. 3, 1974

[21] Appl. No.: 502,671

[52] U.S. Cl. .................................. 331/111; 332/14
[51] Int. Cl.[2] ...................... H03K 1/18; H03K 3/26
[58] Field of Search ......... 331/111, 143; 307/252 F, 307/301; 332/14

[56] References Cited

UNITED STATES PATENTS

| | | | |
|---|---|---|---|
| 3,660,686 | 5/1972 | Muskovac | 331/111 X |
| 3,728,713 | 4/1973 | Alten | 331/111 X |
| 3,794,934 | 2/1974 | Rhee | 331/111 X |

*Primary Examiner*—Siegfried H. Grimm
*Attorney, Agent, or Firm*—H. Christoffersen; Samuel Cohen

[57] ABSTRACT

An oscillator in which the timing capacitor is discharged through the main conduction path of a programmable unijunction transistor via the output circuit of a current mirror amplifier. The linear discharge voltage thereby obtained may be employed to drive the emitter-base junction of a transistor amplifier to obtain output pulses of relatively uniform width.

10 Claims, 2 Drawing Figures

RELAXATION OSCILLATOR HAVING STABLE PULSE WIDTH

Figure 1:
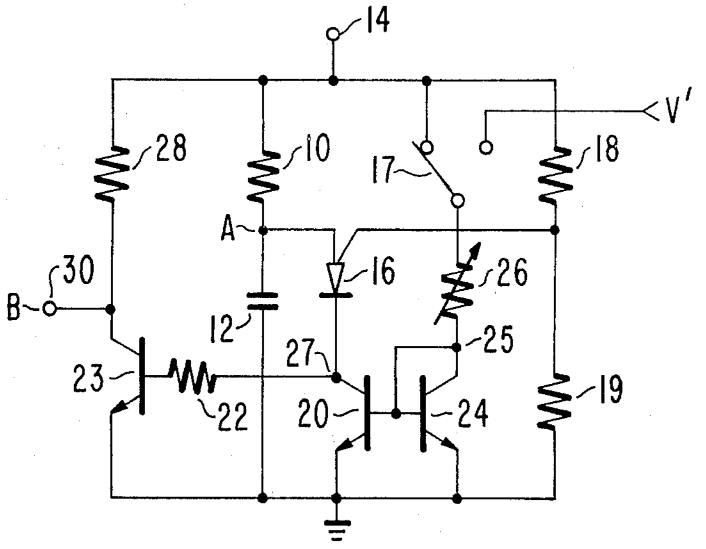

Relaxation oscillator circuits, where the frequency of oscillation and the pulse width are controlled by the charge and discharge times of a capacitive element, are well known in the art. Such circuits suffer from a shortcoming when it is desired to precisely control the pulse width produced by these oscillators. For example, if a discharge period of the capacitor is used to control the pulse width by switching active devices off or on for a given period to time, and if the pulse width is large with respect to the time constant involved, for example, two times the time constant, then a problem arises with respect to the repeatability of the pulse width. As the capacitor discharges to a lower and lower voltage in an exponential manner, and slight variation in the characteristics of the devices switched by the capacitor will produce a relatively large error in the pulse width. This is because the voltage versus time characteristic of the capacitor is relatively flat at this point.

If the capacitor in a relaxation oscillator circuit was discharged at a constant rate, the voltage across the capacitor, with respect to time, would be in the form of a voltage ramp having a negative slope. If such a voltage were used to control the output pulse width by turning an active device(s) to its (their) off or on state, then small variations in the switching characteristics of the active device would produce a relatively small variation in the output pulse width. This means that the pulse width error associated with such a circuit for a given change in the switching characteristics of the active devices would be much smaller than the error present where the capacitor is discharged at an exponential rate.

Figure 2:
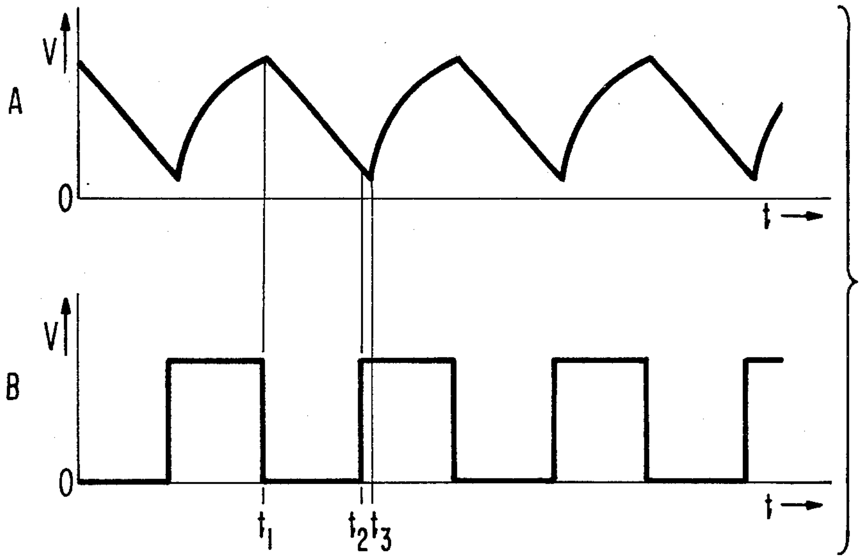

The invention is described in greater detail below and is illustrated in the drawing of which:

FIG. 1 is a schematic circuit diagram of a preferred embodiment of the invention; and FIG. 2 illustrates waveforms present in the circuit of FIG. 1.

In the circuit of FIG. 1, resistor 10 and capacitor 12 are connected in series between terminal 14 and ground. A source of operating potential (not shown) is also connected between terminal 14 and ground. Programmable unijunction transistor (PUT) 16 has its anode electrode connected to the connection between resistor 10 and capacitor 12. Resistors 18 and 19 are connected in series between terminal 14 and ground. The gate electrode of PUT 16 is connected to the connection between these resistors. The cathode electrode of PUT 16 is connected to the collector electrode of transistor 20 and through resistor 22 to the base electrode of transistor 23. The base electrode of transistor 20 is connected to the base and collector electrodes of transistor 24. The collector electrode of transistor 24 is also connected through resistor 26 and switch 17 to terminal 14. The emitter electrodes of transistors 20 and 24 are connected to ground. The collector electrode of transistor 23 is connected through resistor 28 to terminal 14 while the emitter electrode of this transistor is connected to ground. The output of the oscillator circuit is taken at terminal 30.

Before considering the operation of the circuit of FIG. 1, a brief description will be given of the characteristics of PUT 16. The PUT is essentially an anode gated silicon controlled rectifier. The PUT is off when its anode voltage is negative with respect to its gate voltage. When off, the device presents a relatively high impedance between its anode and cathode terminals and any current flow will be exclusively leakage current. When the anode voltage becomes more positive than the gate voltage by an increment equal to the threshold voltage, which is typically 0.4 volts, the device turns on. If the current available at the anode terminal is greater than the specified minimum required for conduction, the PUT will present a low impedance between its anode and cathode terminals. After the PUT has switched to its low impedance state, the device will remain on for as long as there is sufficient anode current to maintain conduction.

In the operation of the circuit of FIG. 1, the gate electrode of PUT 16 is biased to a reference potential by the voltage divider comprising resistors 18 and 19. Capacitor 12 will charge through resistor 10 towards the power supply voltage. The voltage across capacitor 12 also represents the voltage at the anode electrode of the PUT 16. When this anode voltage exceeds the gate voltage by the threshold value, PUT 16 will conduct, presenting a low impedance and providing a discharge path for capacitor 12.

The discharge path for capacitor 12 is between the anode and cathode terminals of PUT 16 and to both the base of transistor 23 through resistor 22 and into the collector of transistor 20. Transistors 20 and 24 comprise a current mirror amplifier and it is this device that is primarily responsible in this invention for causing the discharge of capacitor 12 to be at a constant rather than an exponential rate.

A current mirror amplifier is a three terminal amplifier circuit, generally integrated onto a common semiconductor substrate, in which first and second transistors are connected at their emitter electrodes to a common terminal (ground in this circuit) and at their respective collector electrodes to an input and an output terminal. The first transistor (24 in the present circuit) is provided with collector-to-base feedback which regulates the amplitude of its collector current to equal substantially the amplitude of a current supplied or withdrawn via the input terminal (25 in the present circuit). Current for this transistor is supplied in the embodiment shown by means of variable resistor 26. The base-emitter potential of transistor 24 is applied to the base-emitter junction of transistor 20 causing the collector current supplied or withdrawn via the output terminal 27 to be proportionately related to the input current. The proportion between the input and output currents is dependent largely upon the geometries of the respective transistors and in the inegrated circuit art these geometries can be closely controlled.

When the voltage across capacitor 12 is of sufficient amplitude to trigger PUT 16, the capacitor will begin to discharge. The voltage across capacitor 12 is shown at A of FIG. 2. The initiation of the discharge is shown at time $t_1$. As soon as capacitor 12 begins to discharge, base current drive is provided to transistor 23. As a result, transistor 23 is turned on, causing the output voltage, shown at B of FIG. 2, to drop to a relatively low level. As capacitor 12 discharges, the voltage across the capacitor decreases, as shown at A. A portion of this voltage appears across the base-emitter junction of transistor 23.

As the output current withdrawn by the current mirror via output terminal 27 is a constant current (the base current of transistor 23 is negligible value compared to the collector current of transistor 20 and may be ignored for purposes of this discussion), the voltage across the capacitor drops at a substantially linear rather than at an exponential rate.

At time $t_2$, capacitor 12 has discharged sufficiently that the voltage across the base-emitter junction of transistor 23 is reduded to a value (less than about 0.65 volts) lower than that needed to maintain the transistor in an on condition. At this time, transistor 23 turns off, causing the output voltage to rise to a relatively high level.

After transistor 23 has become cut off, capacitor 12 continues to discharge until time $t_3$. At this time, the voltage across the capacitor will be inadequate to maintain conduction through the PUT. When the PUT turns off, the voltage across capacitor 12 increases in an exponential manner until the PUT is turned on once more, causing the above cycle to repeat.

The control of the rate of discharge of capacitor 12 is not limited to the configuration where resistor 26 is connected to a supply voltage. Switch 17 may be used to couple the input terminal 25 of the current mirror amplifier, through an impedance that may be fixed or variable, to an external source of voltage V′. By varying the amplitude of voltage V′, it is possible to control the pulse width produced by the circuit without changing the frequency of operation, thus prodiving remote control capability for the pulse width.

With respect to the charging impedance for capacitor 12, an impedance other than a resistor may be employed. Also, in some applications a constant current charge path, for example, via a second current mirror, may be employed rather than a simple resistor.

In the circuit of FIG. 1, the pulse width of the output voltage is compensated, to a degree, for variations in temperature or power supply voltage. The PUT anode-to-gate threshold voltage and the base-to-emitter voltage of transistor 23 both have negative temperature coefficients. Therefore, if the temperature increases, the voltage across capacitor 12 at the PUT firing point will be lower tending to produce a pulse of reduced width. This is compensated for the lowering of the base-emitter threshold voltage of transistor 23 so that for a given discharge rate, the pulse width tends to remain constant.

If the supply voltage should increase, capacitor 12 would have to charge to a higher voltage before reaching the PUT threshold voltage because the reference voltage at the PUT gate would also have increased. This would tend to increase the puse width. For a fixed value of resistor 26, the increase in supply voltage increases the input current flowing into the current mirror amplifier. This, in turn, increases the output current withdrawn by the current mirror, allowing capacitor 12 to discharge at a faster rate. Therefore, the increased pulse width which tends to be caused by a voltage increase across the capacitor, is compensated for by the faster discharge rate of this capacitor due to the increased input current (and output current) of the current mirror amplifier. A similar compensating effect occurs when supply voltage decreases.

The current requirements of the present circuit may be reduced by scaling the relative geometries of transistors 20 and 24 comprising the current mirror amplifier. For example, transistor 24 may be scaled to carry one 1/5 the current of transistor 20. If it is desired to power the circuit of FIG. 1 from a battery, such a low current drain would be useful in extending battery life.

What is claimed is:

1. An oscillator circuit comprising in combination:

a circuit output, a circuit common and a circuit power terminal;

a charging circuit comprising charge storage means coupled between said circuit common and said circuit power terminals;

means for providing a reference voltage;

a programmable unijunction transistor having relatively high and relatively low impedance states, said programmable unijunction transistor having first and second main terminals and a control terminal, said control terminal coupled to said means for providing a reference voltage and said first main terminal coupled to said charge storage means, said programmable unijunction transistor assuming its low impedance state whenever the potential across said charge storage means exceeds said reference voltage by a predetermined amount, thereby providing a discharge path for said charge storage means;

means coupled to said second main terminal for discharging said charge storage means at an essentially constant rate; and means responsive to the discharge of said charge storage means for producing an output voltage at said circuit output terminal at a relatively low first level whenever said programmable unijunction transistor assumes its low impedance state and responsive to the voltage across said charge storage means for producing a voltage at said circuit output terminal at a relatively high second level when said voltage drops to lower than a given value.

2. The combination recited in claim 1 where said charging circuit further comprises an impedance connected between said power terminal and said charge storage means.

3. The combination recited in claim 1 where said means for producing an output voltage comprises a switching means having first and second terminals across which said output voltage is produced and a control terminal, said switching means first terminal coupled to said circuit output terminal, said switching means second terminal coupled to said circuit common terminal and said switching means control terminal coupled to said programmable unijunction transistor second main terminal whereby said switching means closes when said programmable unijunction transistor assumes its low impedance state, thereby producing a voltage at a relatively low level and said switching means opens when said programmable unijunction transistor assumes its high impedance state thereby producing a voltage at a relatively high level.

4. The combination recited in claim 3 where said switching means comprises a bipolar transistor having an emitter, a collector and a base electrode, said emitter electrode connected to said circuit common terminal, said collector electrode coupled to said circuit output terminal and said base electrode coupled to said programmable unijunction transistor.

5. An oscillator circuit comprising in combination:

a circuit output, a circuit common and a circuit power terminal;

a charging circuit comprising charge storage means coupled between said circuit common and said circuit power terminals;

means for providing a reference voltage;

a control voltage responsive switching device having relatively high and relatively low impedance states, said device having first and second main terminals and a control terminal, said control terminal coupled to said means for providing a reference voltage and said first main terminal coupled to said charge storage means, said device assuming its low impedance state whenever the potential across said charge storage means exceeds said reference voltage by a predetermined amount, thereby providing a discharge path for said charge storage means;

means coupled to said second main terminal for discharging said charge storage means at an essentially constant rate, said means comprising a current mirror amplifier, said amplifier having an input, an output and a common terminal, said amplifier output terminal coupled to said control voltage responsive switching device second main terminal, said amplifier common terminal connected to said circuit common terminal and said amplifier input terminal coupled to means for providing a bias current to the amplifier whereby the amplitude of said bias current will control the discharge rate of said charge storage means; and means responsive to the discharge of said charge storage means for producing a voltage at said circuit output terminal at a relatively low first level whenever said switching device assumes its low impedance state and responsive to the voltage across said charge storage means for producing a voltage at said circuit output terminal at a relatively high second level when said voltage drops to lower than a given value.

6. The combination recited in claim 5 where said means for providing bias current comprises an impedance connected between said amplifier input terminal and said circuit power terminal.

7. The combination recited in claim 5 where said means for providing bias current comprises an impedance and a power source, said impedance connected between said amplifier input terminal and said power source.

8. A relaxation oscillator comprising, in combination:

a three terminal device having a main conduction path and a control electrode, and whose main conduction path is placed in a low impedance condition when the voltage between one end of said path and said control electrode exceeds a given value;

charge storage means connected at one terminal to a point at a first reference potential and at its second terminal to a terminal for a source of charging current;

a current mirror amplifier having an input terminal receptive of a quiescent current, and output terminal, and a common terminal, said common terminal being connected to said point at said first reference potential;

a point at a second reference potential, said control electrode being connected thereto; and means connecting said main conduction path at said one end to said second terminal of said charge storage means and at its other end to the output terminal of said current mirror amplifier.

9. A relaxation oscillator as set forth in claim 8 wherein said three terminal device comprises a programmable unijunction transistor.

10. A relaxation oscillator as set forth in claim 8, further including a transistor amplifier, the transistor of said amplifier having an emitter-base junction connected between the output terminal of said current mirror amplifier and said point at a first reference potential in a sense to conduct in the forward direction the current flowing through said main conduction path of said three terminal device.

* * * * *